United States Patent [19]

Ohmatsu et al.

[11] Patent Number: 5,001,020
[45] Date of Patent: Mar. 19, 1991

[54] MULTIFILAMENT SUPERCONDUCTING WIRE OF NB₃AL

[75] Inventors: Kazuya Ohmatsu; Masayuki Nagata, both of Osaka, Japan

[73] Assignee: Sumitomo Electric Industries, Ltd., Osaka, Japan

[21] Appl. No.: 540,036

[22] Filed: Jun. 19, 1990

[30] Foreign Application Priority Data

Jun. 26, 1989 [JP] Japan .................. 1-163181

[51] Int. Cl.⁵ ........................................... H01B 12/00
[52] U.S. Cl. ..................... 428/651; 428/614; 428/662; 428/674; 428/930; 505/813
[58] Field of Search ............... 428/614, 651, 662, 674, 428/930

[56] References Cited

U.S. PATENT DOCUMENTS

| | | | |
|---|---|---|---|
| 3,836,404 | 9/1974 | Strauss | 148/11.5 R |
| 4,003,762 | 1/1977 | Ceresara et al. | 148/11.5 R |
| 4,078,299 | 3/1978 | Furuto et al. | 148/11.5 R |
| 4,088,512 | 5/1978 | Pickus et al. | 148/11.5 F |
| 4,330,347 | 5/1982 | Hirayama et al. | 420/930 |
| 4,402,768 | 9/1983 | Flükiger | 148/11.5 D |
| 4,743,713 | 5/1988 | Scanlan | 148/11.5 R |
| 4,746,581 | 5/1988 | Flükiger | 428/930 |
| 4,917,965 | 4/1990 | Inoue et al. | 428/930 |

Primary Examiner—R. Dean
Assistant Examiner—David W. Schumaker
Attorney, Agent, or Firm—Pennie & Edmonds

[57] ABSTRACT

Disclosed herein is a multifilament superconducting wire of Nb₃Al comprising a core part of copper or copper alloy which is provided in a central portion as a stabilizing material and a peripheral part which is provided around the core part and formed by an Nb₃Al filament embedded in a matrix of copper or copper alloy, such that the ratio of copper or copper alloy forming the core part and the peripheral part to the Nb₃Al filament is at least 1 and not more than 5 in sectional area ratio and the diameter of the core part is at least 1/5 of the wire diameter.

3 Claims, 2 Drawing Sheets

- 5 Nb₃Aℓ FILAMENT
- 6 Aℓ CORE
- 7 Nb MATRIX

- 8 Nb₃Aℓ FILAMENT
- 9 Nb FOIL
- 10 Aℓ FOIL

MULTIFILAMENT SUPERCONDUCTING WIRE OF NB3AL

BACKGROUND OF THE INVENTION

1. Field of the Invention

The present invention relates to a multifilament superconducting wire of $Nb_3Al$, which can be applied to a superconducting wire for a nuclear fusion reactor or SMES, for example.

2. Description of the Background Art

A superconductive material of $Nb_3Al$, having a high critical magnetic field which is said to be in excess of 30T and a distortion property which is superior to that of $Nb_3Sn$, is expected as the third practical superconductive material following NbTi and $Nb_3Sn$, particularly as a wire material for a superconducting magnet for a nuclear fusion reactor.

It has recently been reported that the critical current density of an $Nb_3Al$ superconducting wire is increased to a level which is equivalent to or higher than that of $Nb_3Sn$ when Nb and Al parts thereof are reduced to about 0.1 $\mu$m in thickness.

However, it has been impossible to obtain a long superconducting wire of $Nb_3Al$ since elongation of the $Nb_3Al$ superconductive material is industrially difficult due to inferior workability of Nb and Al. Although attempts have been made to elongate $Nb_3Al$ materials into long wire by a jelly roll method, an Nb pipe method and the like, no satisfactory results have been obtained. For example, a length of at least 600 m is required for wire which is applied to a superconducting magnet for a nuclear fusion reactor, and a length of at least 1000 m is currently desired as the target of elongation. While some attempts have been made to prepare a wire with sheath of Cu-10%Ni, it is necessary to use a stabilizing material of Cu.

SUMMARY OF THE INVENTION

An object of the present invention is to solve the aforementioned problems of the prior art and provide a multifilament superconducting wire of $Nb_3Al$, which is so improved in workability as to enable improvement of critical current density by reducing Nb and Al parts in thickness as well as to enable elongation.

A multifilament superconducting wire of $Nb_3Al$ according to the present invention comprises a core part of copper or copper alloy which is provided in a central portion as a stabilizing material and a peripheral part which is provided around the core part and formed by an $Nb_3Al$ filament embedded in a matrix of copper or copper alloy. The ratio of copper or copper alloy forming the core part and the matrix of the peripheral part to the $Nb_3Al$ filament is at least 1 and not more than 5 in sectional area ratio, and the diameter of the core part is at least 1/5 of the wire diameter.

According to a preferred embodiment of the present invention, the $Nb_3Al$ filament is formed by Al cores which are arranged in a matrix of Nb. In this embodiment, high purity copper is preferably employed as a material of matrix.

According to another preferred embodiment of the present invention, the $Nb_3Al$ filament is formed by superposing an Nb foil member with an Al foil member and spirally rolling the superposed members. In this embodiment, copper alloy containing Mn, Ni, Cr, Si or the like is preferably employed as a material of matrix.

According to the present invention, the sectional area ratio (hereinafter referred to as "copper ratio") of copper or copper alloy forming the core part and the matrix to the $Nb_3Al$ filament is at least 1 and not more than 5. If the copper ratio exceeds 5, the filament is burned out due to difference in work strength between copper or copper alloy and the $Nb_3Al$ filament to deteriorate critical current density, although workability of the wire remains unchanged. If the copper ratio is less than 1, on the other hand, it is difficult to satisfy such a condition that the diameter of the core part is at least 1/5 of the wire diameter as hereinabove described, and workability is deteriorated.

According to the present invention, the core part is adapted to improve workability of the overall wire. The diameter of the core part is rendered at least 1/5 of the wire diameter according to the present invention, to provide workability for enabling elongation of the wire rod to a length of at least 1000 m.

The inventive multifilament superconducting wire of $Nb_3Al$ is excellent in workability since the same has a core part of copper or copper alloy whose diameter is at least 1/5 of the wire diameter. Further, the inventive wire can be elongated with no burnout of the filament since the copper ratio is at least 1 and not more than 5. Thus, a long superconducting wire of at least 1000 m in length can be obtained, so that the same is applied to a wire for a superconducting magnet for a nuclear fusion reactor, for example.

Further, Nb and Al parts can be reduced in thickness due to excellent workability. Thus, it is possible to greatly improve critical current density.

These and other objects, features, aspects and advantages of the present invention will become more apparent from the following detailed description of the present invention when taken in conjunction with the accompanying drawings.

DESCRIPTION OF THE PREFERRED EMBODIMENTS

Example 1 and Reference Example 1

Example 1

Figure 1:
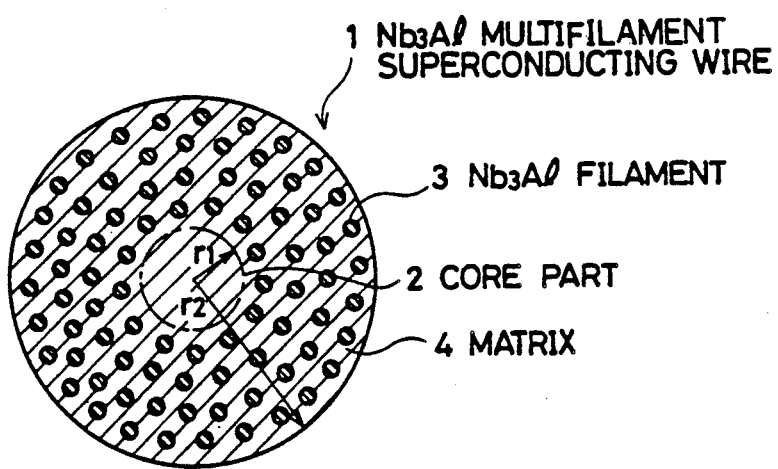
FIG. 1 is a sectional view showing Example of the present invention.

FIG. 1 is a sectional view showing an $Nb_3Al$ multifilament superconducting wire 1, which was prepared according to the present invention. Referring to FIG. 1, symbol $r_1$ denotes the radius of a core part 2. The radius $r_1$ is 0.15 mm, and hence the core part 2 has a diameter $R_1$ of 0.3 mm.

Symbol $r_2$ denotes the radius of the $Nb_3Al$ multifilament superconducting wire 1. This radius $r_2$ is 0.5 mm, and hence the $Nb_3Al$ multifilament superconducting wire 1 has a diameter $R_2$ of 1.0 mm. The core part 2 is made of copper, and $Nb_3Al$ filaments 3 are embedded in a matrix 4 of copper around the core part 2. The diameter of each Nb₃Al filament 3 is 25 μm. The copper ratio is 2.5.

Reference Example 1

Figure 2:
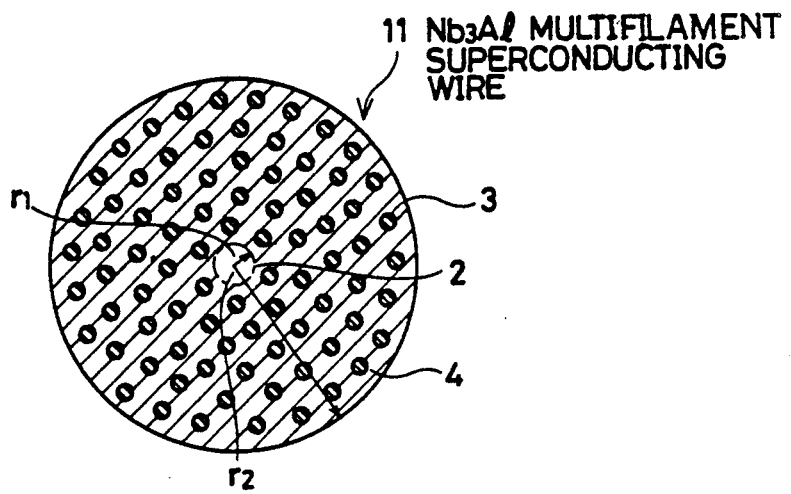
FIG. 2 is a sectional view showing a multifilament superconducting wire of $Nb_3Al$ according to reference example.

FIG. 2 shows an Nb₃Al multifilament superconducting wire 11, which was prepared as reference example. Referring to FIG. 2, the radius $r_1$ of a core part 2 is 0.05 mm, and hence the core part 2 has a diameter $R_1$ of 0.1 mm. The radius $r_2$ of the Nb₃Al multifilament superconducting wire 11 is 0.5 mm, and hence the diameter thereof is 1.0 mm.

The diameter of each Nb₃Al filament 3 is 25 μm, similarly to Example 1. Also similarly to Example 1, the copper ratio is 2.5.

The diameter of the core part 2 of Example 1 is 3/10 of the wire diameter within the scope of the present invention, while the diameter of the core part 2 of reference example 1 is 1/10 of the wire diameter. This value is out of the scope of the present invention.

Samples of wires were prepared so as to define the aforementioned Example 1 and reference example 1 upon drawing to wire diameters of 1.0 mm. These samples were first drawn to 300 m in length with wire diameters of 2.0 mm. Thereafter attempts were made to reduce the wire diameters to 0.5 mm. The samples were stepwise wire-drawn to diameters of 2.0 to 1.5 mm, 1.5 to 1.2 mm, 1.2 to 1.0 mm, 1.0 to 0.8 mm and 0.8 to 0.5 mm. Table 1 shows the numbers of burnouts caused in the samples.

TABLE 1

| Wire Diameter (mm) | Number of Burnouts | |
|---|---|---|
| | Example 1 | Reference Example 1 |
| 2.0 to 1.5 | 0 | 2 |
| 1.5 to 1.2 | 0 | 3 |
| 1.2 to 1.0 | 0 | 2 |
| 1.0 to 0.8 | 1 | 5 |
| 0.8 to 0.5 | 2 | 9 |

As clearly understood from Table 1, the wire of Example 1 according to the present invention is hardly burned out as compared with the wire according to reference example 1. According to Example 1, it was possible to obtain a wire of about 1500 m in length with the final wire diameter of 0.5 mm. According to reference example 1, on the other hand, the maximum length was merely 150 m, and most of the samples were shorter than 100 m.

Examples 2 and 3 and Reference Examples 2 and 3

Examples 2 and 3 and reference examples 2 and 3 were so prepared that wire diameters $R_2$ were 1.0 mm, diameters of Nb₃Al filaments were 25 μm, diameters $D_1$ of core parts were 0.3 mm, and copper ratios were as follows:
Reference Example 2: 5.5
Example 2: 4.5
Example 3: 1.5
Reference Example 3: 0.9

The aforementioned four types of wires were drawn to wire diameters of 0.25 mm. The wires according to reference example 2 and Examples 2 and 3 were excellent in workability and could be drawn to lengths of at least 1000 m. However, the wire according to reference example 3, whose copper ratio was smaller as compared with the scope of the present invention, caused large amounts of burnouts when the same was drawn to a wire diameter of not more than 1 mm, to cause difficulty in elongation.

Figure 5:
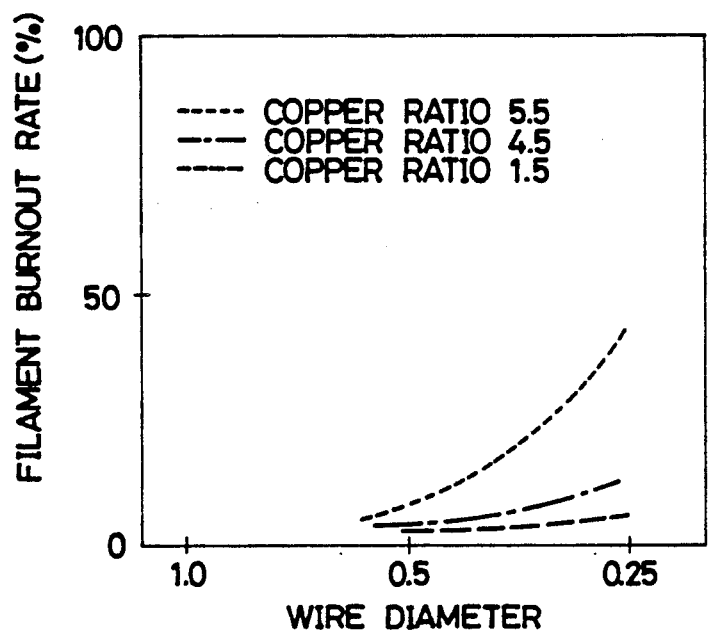
FIG. 5 shows filament burnout rates in relation to various copper ratios.

FIG. 5 shows the results of filament burnout rates measured as to reference example 2 and Examples 2 and 3.

As clearly understood from the results shown in FIG. 5, the filament burnout rate was abruptly increased at a wire diameter of about 0.5 mm in reference example 2, whose copper ratio was larger as compared with the scope of the present invention.

In each of Examples 2 and 3 which were drawn to wire diameters of 0.25 mm, the critical current density exceeded 500 A/mm² per unit area at 10T, while the critical current density of reference example 2 was merely about 300 A/mm².

In order to study influence exerted by the wire diameter, i.e., thickness values of Nb and Al parts in the Nb₃Al filaments to the critical current density, samples of the wire according to Example 3 were drawn to wire diameters of 1.0 mm and 0.5 mm respectively. The critical current density of each sample was measured after prescribed heat treatment.

In the sample having the wire diameter of 1.0 mm, the thickness levels of the Nb and Al parts became designed values of 0.35 μm and 0.10 μm respectively. In the sample having the wire diameter of 0.5 mm, on the other hand, the thickness levels of the Nb and Al parts became designed values of 0.175 μm and 0.05 μm respectively.

Heat treatment was performed under five types of conditions of at 850° C. for 0.5 h., at 825° C. for 0.5 h., at 800° C. for 0.5 h., at 800° C. for 1.0 h. and at 800° C. for 2.0 h. Table 2 shows critical current density of each sample at 10T.

TABLE 2

| Heat Treatment | Wire Diameter Critical Current Density (10 T, 4.2 K) | |
|---|---|---|
| | 1.0 mm | 0.5 mm |
| 850° C. × 0.5 h. | 400 A/mm² | 480 A/mm² |
| 825° C. × 0.5 h. | 450 A/mm² | 560 A/mm² |
| 800° C. × 0.5 h. | 300 A/mm² | 450 A/mm² |
| 800° C. × 1.0 h. | 325 A/mm² | 550 A/mm² |
| 800° C. × 2.0 h. | 350 A/mm² | 530 A/mm² |

As understood from the results shown in Table 2, it has been recognized that the critical current density can be improved by reducing the Nb and Al parts in thickness.

According to the present invention, as hereinabove described, it is possible to elongate the superconducting wire by improving workability thereof, while critical current density can also be improved by reducing the Nb and Al parts in thickness.

Figure 3:
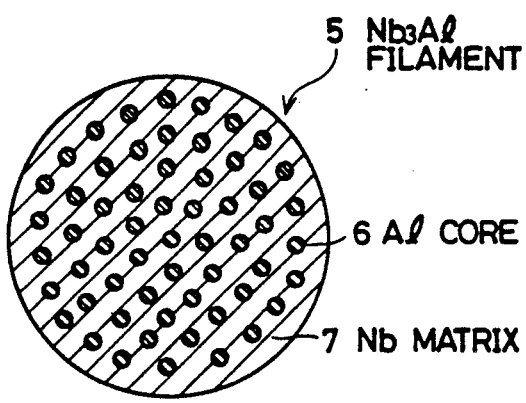
FIG. 3 is a sectional view showing an exemplary $Nb_3Al$ filament.
Figure 4:
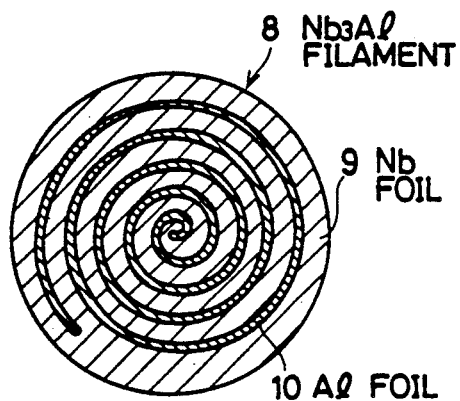
FIG. 4 is a sectional view showing another exemplary $Nb_3Al$ filament.

Although the structures of the Nb₃Al filaments have not particularly been described with reference to the above Examples, the structure of an Nb₃Al filament is not particularly restricted in the present invention. For example, an Nb₃Al filament 5 may be formed by Al cores 6 which are arranged in an Nb matrix 7 as shown in FIG. 3, or an Nb₃Al filament 8 may be formed by adhering an Nb foil member 9 with an Al foil member 10 and spirally rolling the adhered members as shown in FIG. 4.

Examples 4 to 7 and Reference Examples 4 to 7

Samples of wires were prepared similarly to Example 1 or reference example 1 except that copper alloy, which contains 5 percent Mn, Ni, Cr, or Si by weight, is employed as a material of matrix in place of pure copper. These samples were stepwisely wire-drawn to diameters of 2.0 to 1.5 mm, 1.5 to 1.2 mm, 1.2 to 1.0 mm, 1.0 to 0.8 mm and 0.8 mm to 0.5 mm. Table 3 shows the numbers of burnouts caused in the samples.

TABLE 3

| Wire Diameter (mm) | Number of Burnouts | | | | | | | |
|---|---|---|---|---|---|---|---|---|
| | Example | | | | Reference Example | | | |
| | 4 | 5 | 6 | 7 | 4 | 5 | 6 | 7 |
| 2.0 to 1.5 | 0 | 0 | 0 | 0 | 0 | 0 | 0 | 0 |
| 1.5 to 1.2 | 0 | 0 | 0 | 0 | 1 | 0 | 2 | 0 |
| 1.2 to 1.0 | 0 | 0 | 0 | 0 | 3 | 2 | 4 | 2 |
| 1.0 to 0.8 | 0 | 0 | 1 | 0 | 2 | 3 | 6 | 2 |
| 0.8 to 0.5 | 1 | 2 | 1 | 1 | 5 | 7 | 15 | 6 |

As clearly understood from Table 1, the wires of Examples 4 to 7 according to the present invention is hardly burned out as compared with the wires of reference examples 4 to 7.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A multifilament superconducting wire of $Nb_3Al$ comprising:
    a core part of copper or copper alloy provided in a central portion as a stabilizing material; and
    a peripheral part provided around said core part, said peripheral part being formed by an $Nb_3Al$ filament embedded in a matrix of copper or copper alloy,
    the ratio of said copper or copper alloy forming said core part and said matrix of said peripheral part to said $Nb_3Al$ filament being at least 1 and not more than 5 in sectional area ratio,
    the diameter of said core part being at least 1/5 of the wire diameter.

2. A multifilament superconducting wire of $Nb_3Al$ in accordance with claim 1, wherein said $Nb_3Al$ filament is formed by Al cores arranged in an Nb matrix.

3. A multifilament superconducting wire of $Nb_3Al$ in accordance with claim 1, wherein said $Nb_3Al$ filament is formed by superposing an Nb foil member with an Al foil member and spirally rolling superposed said foil members.

* * * * *